US008347475B2

(12) United States Patent
Wang et al.

(10) Patent No.: US 8,347,475 B2
(45) Date of Patent: Jan. 8, 2013

(54) HANDLE STRUCTURE

(75) Inventors: Shi-Feng Wang, Shanghai (CN); Ji-Peng Xu, Shanghai (CN); Tsai-Kuei Cheng, Taipei (TW)

(73) Assignee: Inventec Corporation, Taipei (TW)

( * ) Notice: Subject to any disclaimer, the term of this patent is extended or adjusted under 35 U.S.C. 154(b) by 868 days.

(21) Appl. No.: 12/488,226

(22) Filed: Jun. 19, 2009

(65) Prior Publication Data

US 2010/0257715 A1 Oct. 14, 2010

(30) Foreign Application Priority Data

Apr. 14, 2009 (TW) ............................... 98112353 A

(51) Int. Cl.

| | |
|---|---|
| ***B25B 27/00*** | (2006.01) |
| ***B66F 3/00*** | (2006.01) |
| ***B60R 25/10*** | (2006.01) |
| ***B60R 25/00*** | (2006.01) |
| ***B65D 55/14*** | (2006.01) |
| ***E05B 65/12*** | (2006.01) |

(52) U.S. Cl. ..... 29/270; 254/120; 254/131; 340/426.28; 70/158; 70/237

(58) Field of Classification Search .................... 29/270; 70/158, 237, 69, 78, 279.1, 283; 254/120, 254/131, 8 B; 340/426.28, 545.6, 296; 116/33, 116/86; 296/905, 37.6

See application file for complete search history.

(56) References Cited

U.S. PATENT DOCUMENTS

| | | | | |
|---|---|---|---|---|
| 6,081,186 | A * | 6/2000 | Adams | 340/426.28 |
| 6,497,399 | B1 * | 12/2002 | Nelson | 254/131 |
| 7,516,632 | B2 * | 4/2009 | Poppell | 70/279.1 |

* cited by examiner

*Primary Examiner* — Lee D Wilson

*Assistant Examiner* — Alvin Grant

(74) *Attorney, Agent, or Firm* — J.C. Patents

(57) ABSTRACT

A handle structure suitable for disposing on a surface of a carrier is provided. The carrier has a locating part is assemble to a case. The handle structure includes a holder, an elastic element and a fastening element. The holder has a rotating axis and a locating element, and has a first end and a second end opposite thereto. The rotating axis connecting to the carrier is disposed on the first end, and the holder is pivoted on the surface. The locating element disposed on the first end interferes with the locating part. The elastic element has a first fixing part fixed to the carrier and a pushing part connected to the first fixing part and pushing against the holder. The fastening element has a second fixing part fixed to the carrier and a fastening part connected to the second fixing part and fastened to the second end.

8 Claims, 3 Drawing Sheets

HANDLE STRUCTURE

CROSS-REFERENCE TO RELATED APPLICATION

This application claims the priority benefit of Taiwan application serial no. 98112353, filed on Apr. 14, 2009. The entirety of the above-mentioned patent application is hereby incorporated by reference herein and made a part of specification.

BACKGROUND OF THE INVENTION

1. Field of the Invention

The present invention relates to a handle structure, and more particularly to a handle structure applicable to a carrier.

2. Description of Related Art

Recently, the commonly used server host in the industry is mainly a blade server, or a stackable and serially connected rack mount computer host. In the rack mount computer, the size of a main board in the computer host is greatly reduced, and a CPU, a chipset, a memory, and a hard disk are respectively disposed to a carrier, so as to constitute an electronic module. The server has a plurality of electronic modules to expand the performance thereof.

However, a quite strongly force is required to disassemble the electronic module, and the disassemble operation is hard to be performed due to the force is difficult to be applied in a narrow space. Moreover, the connecter is easily to be damaged when exerting an excessive force to the connecter. Therefore, it is a problem to be urgently solved how to easily detach the electronic module.

SUMMARY OF THE INVENTION

The present invention provides a handle structure adapted to assemble to a carrier, and the handle structure is capable of fixing a holder to an initial position.

The present invention provides a handle structure suitable for disposing on a surface of a carrier, wherein the carrier is assemble to a case, and the case has a locating part. The handle structure includes a holder, an elastic element and a fastening element. The holder has a rotating axis and a locating element, and has a first end and a second end opposite thereto. The rotating axis is disposed on the first end and suitable for connecting to the carrier, such that the holder can be pivoted on the surface. The locating element is disposed on the first end and suitable for interfering with the locating part, such that the carrier is fixed to the case. The elastic element has a first fixing part and a pushing part. The first fixing part is fixed to the carrier. The pushing part is connected to the first fixing part and is pushed against the holder. The fastening element has a second fixing part and a fastening part. The second fixing part is fixed to the carrier. The fastening part is connected to the second fixing part and is fastened to the second end. The holder locates an initial position when the holder is fastened to the fastening element When the fastening part and the holder are not interfered with each other, the elasticity of the pushing part is applied to the holder, and thus the holder leaves the initial position. When the holder leaving the initial position pushes the pushing part, the fastening part is thus fastened to the holder, and the holder is fixed to the initial position.

When the fastening part being moved, the fastening part and the holder are not interfered with each other, the elasticity of the elastic element is applied to the holder, and thus the holder deviated from the initial position. When the holder leaving the initial position pushes against the pushing part, the holder is thus fastened to the fastening part, and the holder is fixed to an initial position.

According to one embodiment of the present invention, the material of fastening element comprises plastic.

According to one embodiment of the present invention, the material of the elastic element comprises metal.

According to one embodiment of the present invention, the holder further comprises a notch, wherein the notch is disposed on the second end, and the shape of the notch is fitting to the fastening part.

According to one embodiment of the present invention, the handle structure further comprises a protruding element, wherein the protruding element and the carrier are integrally formed, and the protruding element adjacent to the holder. The holder is suitable for interfering with the protruding element of the carrier, such that the holder applies an acting force to the carrier.

According to one embodiment of the present invention, the fastening element has an operation part disposed on a side edge thereof not adjacent to the holder. When an acting force away from the holder is applied to the operation part, the interference between the fastening part and the holder is eliminated, and the holder thus deviates from the initial position due to the elasticity of the elastic element.

According to one embodiment of the present invention, the elastic element has a touch portion disposed on one end of the holder adjacent the pushing part to push the holder.

According to one embodiment of the present invention, the pushing part comprises a fixing arm and a sliding arm, wherein the fixing arm is fixed to the first fixing part and the sliding arm is glidingly disposed on the first fixing part. In addition, when the elastic element is not pushed by the holder, an included angle between the sliding arm and the first fixing part is 45 degrees, for example. The included angle is gradually decreased while the elastic element is pushed by the holder.

Based on the above, the handle structure of the present invention has the elastic element and the fastening element, such that users are able to take out the holder for operation by pulling the fastening element, and able to push the holder to the elastic element, so as to re-fix the holder at the initial position.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
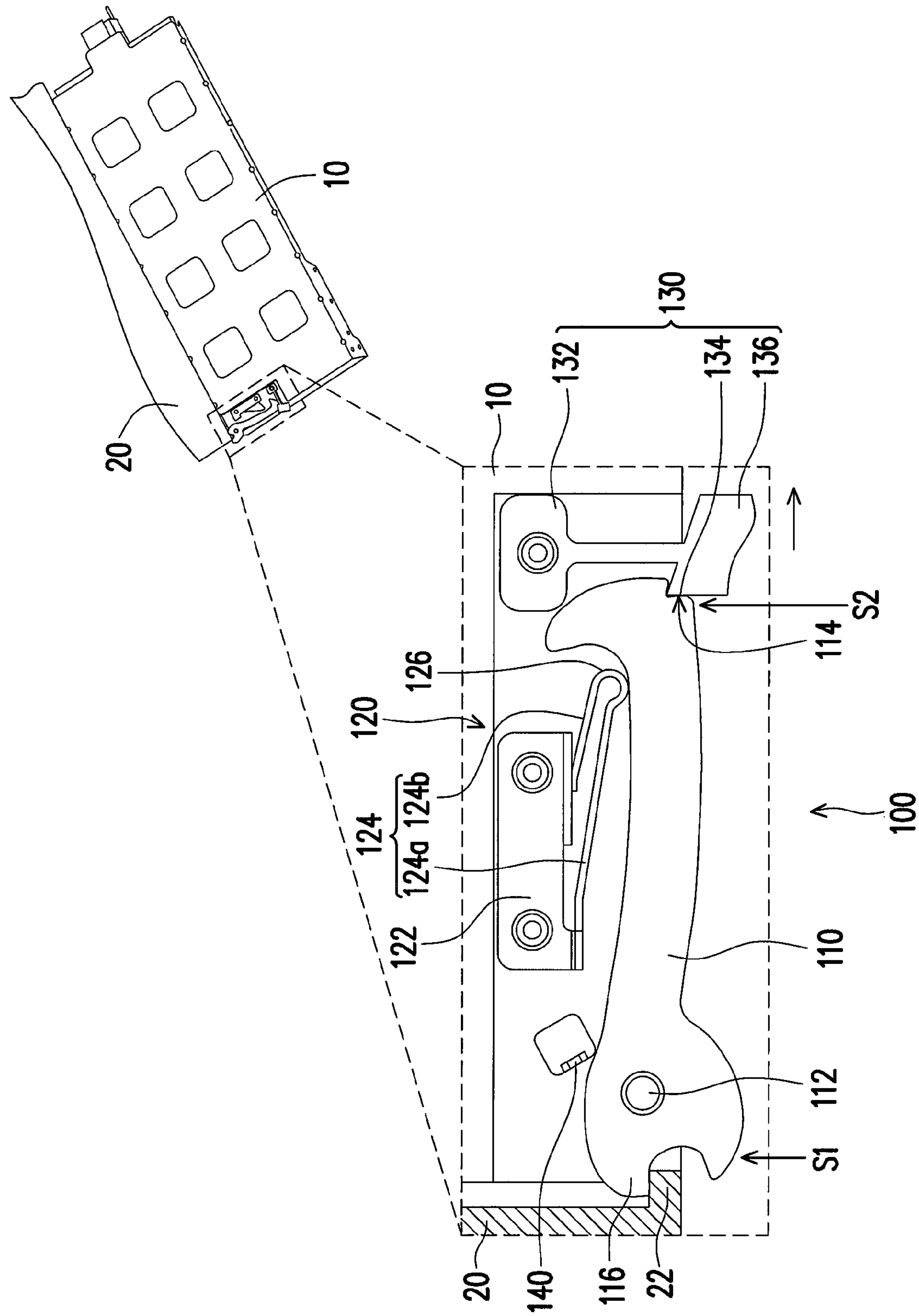
FIG. 1 illustrates a schematic view of a holder of a handle structure disposed on the initial position according to one embodiment of the present invention.

FIG. 1 illustrates a schematic view of a holder of a handle structure disposed on the initial position according to one embodiment of the present invention. Referring to FIG. 1A, a handle structure 100 is suitable for disposing on one surface of the carrier 10, wherein the carrier 10 is assemble to a case 20 and the case 20 has a locating part 22. The handle structure 100 includes a holder 110, an elastic element 120 and a fastening element 130. FIG. 1 merely illustrates a portion of the case 20 including the locating element 22 rather than overall externals of the case 20.

The holder 110 has a rotating axis 112 and a locating element 116, and has a first end S1 and a second end S2 opposite to the first end S1. The rotating axis 112 is disposed on one end of the holder 110 distant from the fastening element 130, wherein said end is namely as the first end S1 in this embodiment. The rotating axis 112 is suitable for connected to the carrier 10. The holder 110 can be alternatively pivoted on the surface of the carrier 10 by using the rotating axis 112 to being fixed to the carrier 10. The locating element 116 is disposed on the first end S1 and adjacent to the rotating axis 112. The locating element 116 is suitable for interfering with the locating part 22, so as to fix the carrier 10 to the case 20.

The elastic element 120 has a first fixing part 122 and a pushing part 124. The first fixing part 122 is adapted to fix to the carrier 10. One end of the pushing part 124 is connected to the first fixing part 122, and the other end of the pushing part 124 pushes against one side of the holder 110.

The fastening element 130 has a second fixing part 132 and a fastening part 134. The second fixing part 132 is fixed to the carrier 10. One end of the fastening part 134 is connected to the second fixing part 132, and the other end of the fastening part 134 is fastened to the second end S2 of the holder 110. Herein, when the holder 110 is fastened by the fastening part 134, the position is defined as an initial position of which the holder 110 locates. The holder 110 can not free to rotate due to the interference of the fastening part 134 when the holder 110 locates the initial position.

In the present embodiment, the holder 110 further includes a notch 114, wherein the notch 114 is disposed on one end of the holder 110 adjacent to the fastening element 130. The shape of the notch 114 is fitting to the fastening part 134, so as to clip the fastening part 134 to the notch 114, and thus the holder 110 can fix to the initial position firmly.

Figure 2:
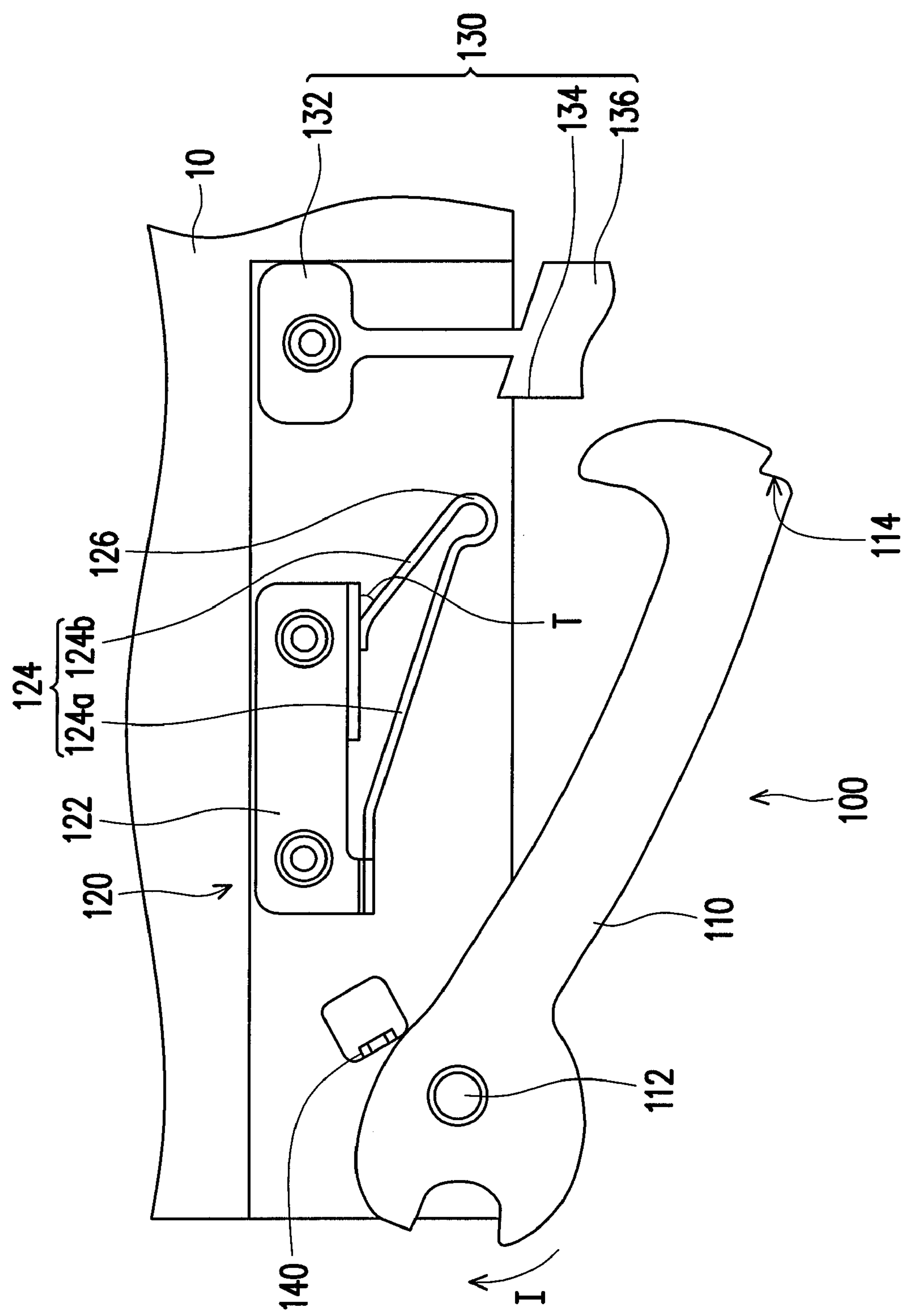
FIG. 2 illustrates a schematic view of the holder of the handle structure of FIG. 1 deviated from the initial position.

FIG. 2 illustrates a schematic view of the holder of the handle structure of FIG. 1 deviated from the initial position. Referring to FIG. 1 and FIG. 2, in the present embodiment, the fastening element 130 may have an operation part 136. The operation part 136 is disposed on the end of the fastening part 134 opposite to the second fixing part 132 and on a side edge not adjacent to the holder 110. The operation part 136 is suitable for providing users to hold for applying forces to the fastening element 130.

When users need to use the handle structure 100, the operation part 136 is pulled in a direction away from the holder 110, so as to eliminate the interference of the fastening part 134 to the holder 110. The elasticity of the elastic element 120 is applied to the holder 110, such that the holder 110 is sprung out along the rotating direction I from the initial position, and thus users can perform operations to the holder 110. In addition, when the holder 110 are not required to be used, the holder 110 can be pushed back to the initial position along an opposite direction of the rotating direction I, such that the holder 110 pushes against the pushing part 124 and the fastening part 134 is able to fasten the notch 114 to fix the holder 110 at the initial position.

In the present embodiment, the elastic element 120 offers elasticity to the holder 110, such that the holder 110 is sprung out from the initial position. Moreover, the holder 110 pushes against the elastic element 120 while turning back to the initial position, the elastic element 120 accordingly needs to suffer more deformation. Therefore, the material of the elastic element 120 is required a material having good elasticity, such as metal material. On the contrary, since the fastening element 130 needs merely a slightly movement, the material of which is not requested an excellent elasticity and can be plastic materials.

In the present embodiment, the elastic element 120 can have a touch portion 126 disposed on one end of the pushing part 124 adjacent the holder 110. The touch portion 126 can be a circle structure. By using the circle side to push the holder 110, the holder 110 can be pushed smoothly when touch portion 126 touches the holder 110.

Furthermore, in this present embodiment, the pushing part 124 can comprise a fixing arm 124*a* and a sliding arm 124*b*. The fixing arm 124*a* is connected to the touch portion 126 by one end, and fixed to the first fixing part 122 by the other end. The sliding arm 124*b* is connected to the touch portion 126 by one end, and glidingly disposed on the one side of the first fixing part 122 by the other end. Moreover, when the elastic element 120 is not pushed against by the holder 110, an included angle T between the sliding arm 124*b* and the first fixing part 122 can be 45 degrees, which is defined as an initial-state angle. When the elastic element 120 is pushed against by the holder 110, the sliding arm 124*b* moves along the side of the first fixing part 122, and the included angle T is gradually decreased accordingly.

Figure 3:
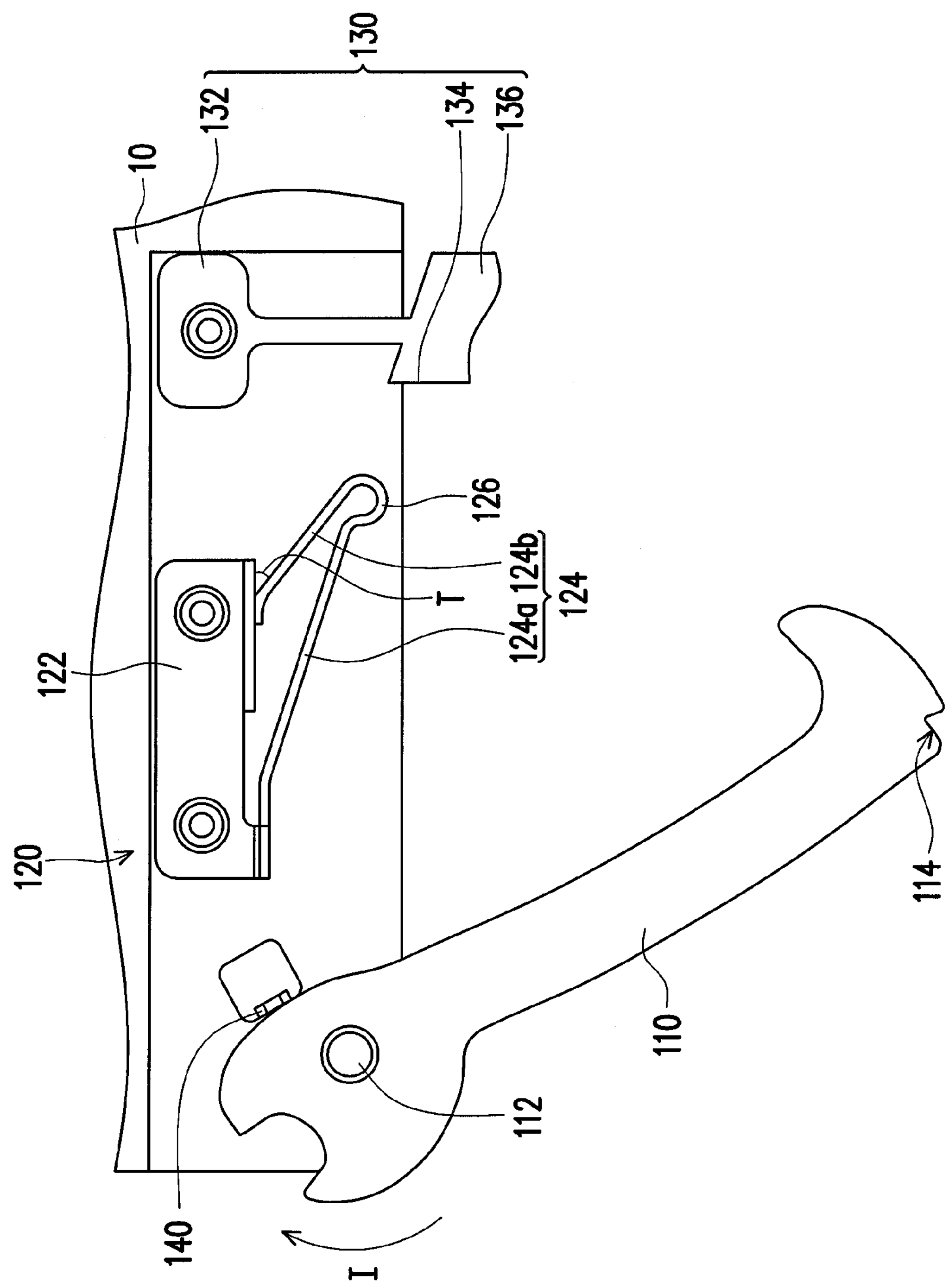
FIG. 3 illustrates a schematic view of the holder of the handle structure of FIG. 1 deviated from the initial position.

FIG. 3 illustrates a schematic view of the holder of the handle structure of FIG. 1 deviated from the initial position. Referring to FIG. 3, in the present embodiment, the handle structure 100 further includes a protruding element 140. The protruding element 140 and the carrier 10 are integrally formed, and the protruding element 140 is disposed adjacent to the holder 110. The protruding element 140 can be an edge fold of the carrier 10 bended upward.

When users need to disassemble the carrier 10 from the case 20, like the aforesaid steps mentioned above, the holder 110 is sprung out by operating the fastening element 130, and the holder 110 deviated from the initial position is continued to be rotated along the rotating direction I, and the first end S1 of the holder 110 is thus pushed against the protruding element 140. In the meantime, the holder 110 is continued to be exerted force thereon along the rotating direction. By using a rotating axis 112 as a pivot, and the portion of the holder 110 pushed against the protruding element 140 serves as an anti-force point, the protruding element 140 is levered to exert force thereon, such that the carrier 10 is disassembled easily from the case 20.

Based on the above, the handle structure of the invention comprises the elastic element and the fastening element, and thus users can take out the holder to perform operations by pulling the fastening element. Moreover, when the holder is no need to be used, the holder can push against the elastic element to fix afresh at the initial position, so as to accommodating the holder. Besides, the carrier is easily to be disassembled form the case by pushing the holder against the protruding element and using the rotating axis as a pivot to exert force on the protruding element.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A handle structure, suitable for disposing on a surface of a carrier, the carrier assembled to a case and the case having a locating part, the handle structure comprises:

a holder having a rotating axis and a locating element, and having a first end and a second end opposite to the first end, wherein the rotating axis is disposed on the first end and is suitable for connecting to the carrier, such that the holder is suitable for pivoting on the surface, and the locating element is disposed on the first end and is suitable for interfering with the locating part, so as to fix the carrier to the case;

an elastic element having a first fixing part and a pushing part, wherein the first fixing part is suitable for fixing to the carrier, the pushing part comprises a fixing arm and a sliding arm, the fixing arm is fixed to the first fixing part, and the sliding arm is glidingly disposed on the first fixing part, and the pushing part pushes against the holder;

a fastening element having a second fixing part and a fastening part, wherein the second fixing part is suitable for fixing to the carrier, the fastening part is connected to the second fixing part and fastens to the second end, the holder located an initial position when the holder is fastened by the fastening element; wherein, when interference of the fastening part and the holder is eliminated, the holder deviates from the initial position due to elasticity of the pushing part applying to the holder; and when the holder deviated from the initial position pushes against the pushing part, the holder is fastened to the fastening part and is fixed at the initial position.

2. The handle structure as claimed in claim 1, wherein a material of the fastening element comprises plastic.

3. The handle structure as claimed in claim 1, wherein a material of the elastic element comprises metal.

4. The handle structure as claimed in claim 1, wherein the holder further comprising a notch disposed on the second end, and a shape of the notch is fitting to the fastening part.

5. The handle structure as claimed in claim 1, further comprising a protruding element, wherein the protruding element and the carrier are integrally formed, the protruding element is adjacent to the holder, the holder is suitable for interfering with the protruding element, such that the holder offers an acting force to the carrier.

6. The handle structure as claimed in claim 1, wherein the fastening element has an operation part disposed on a side edge of the fastening element not adjacent to the holder, when an acting force away from the holder is applied to the operation part, interference between the fastening part and the holder are eliminated, such that the holder deviates from the initial position due to elasticity of the elastic element.

7. The handle structure as claimed in claim 1, wherein the elastic element has a touch portion disposed on one end of the holder adjacent the pushing part to push against the holder.

8. The handle structure as claimed in claim 1, when the elastic element not pushed by the holder, an included angle between the sliding arm and the first fixing part is substantially 45 degrees, and the included angle is gradually decreased while the elastic element being pushed by the holder.

* * * * *